US012598903B2

(12) United States Patent
Fukuda

(10) Patent No.: US 12,598,903 B2
(45) Date of Patent: Apr. 7, 2026

(54) MANUFACTURING METHOD OF DISPLAY DEVICE

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 142 days.

(21) Appl. No.: 18/420,824

(22) Filed: Jan. 24, 2024

(65) Prior Publication Data

US 2024/0276859 A1 Aug. 15, 2024

(30) Foreign Application Priority Data

Feb. 15, 2023 (JP) ................................. 2023-021708

(51) Int. Cl.
*H10K 71/70* (2023.01)
*H10K 59/80* (2023.01)

(52) U.S. Cl.
CPC ........... *H10K 71/70* (2023.02); *H10K 59/871* (2023.02)

(58) Field of Classification Search
None
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2013/0187142 A1* | 7/2013 | Yamazaki | G09G 3/3291 257/40 |
| 2019/0363275 A1 | 11/2019 | Ochi et al. | |
| 2022/0077251 A1 | 3/2022 | Choung et al. | |
| 2022/0149313 A1* | 5/2022 | Nakamura | G02F 1/1333 |

FOREIGN PATENT DOCUMENTS

| | | | | |
|---|---|---|---|---|
| CN | 108352143 A | * | 7/2018 | ......... H01L 25/0753 |
| EP | 1865564 A1 | * | 12/2007 | ....... C09K 11/77742 |
| JP | 2000-195677 A | | 7/2000 | |
| JP | 2004-207217 A | | 7/2004 | |
| JP | 2008-135325 A | | 6/2008 | |
| JP | 2009-032673 A | | 2/2009 | |
| JP | 2010-118191 A | | 5/2010 | |
| JP | 2011-134489 A | | 7/2011 | |
| WO | WO-2011086500 A2 | * | 7/2011 | ........... H10K 59/873 |
| WO | 2018/179308 A1 | | 10/2018 | |
| WO | WO-2022163353 A1 | * | 8/2022 | ........... H01S 5/0218 |

* cited by examiner

*Primary Examiner* — Guerrier Merant
(74) *Attorney, Agent, or Firm* — XSENSUS LLP

(57) ABSTRACT

According to one embodiment, a manufacturing method is a method for manufacturing a display device including first, second and third display elements which emit light of different colors and includes preparing a substrate, forming the first display element on the substrate, and performing a first lighting inspection for causing the first display element to light up before forming the second display element and the third display element.

20 Claims, 12 Drawing Sheets

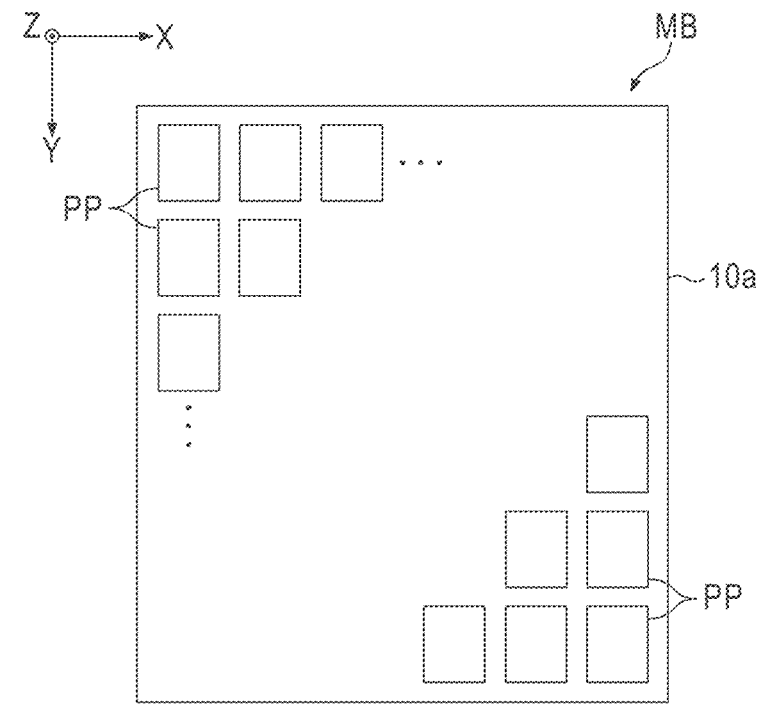
F I G. 4
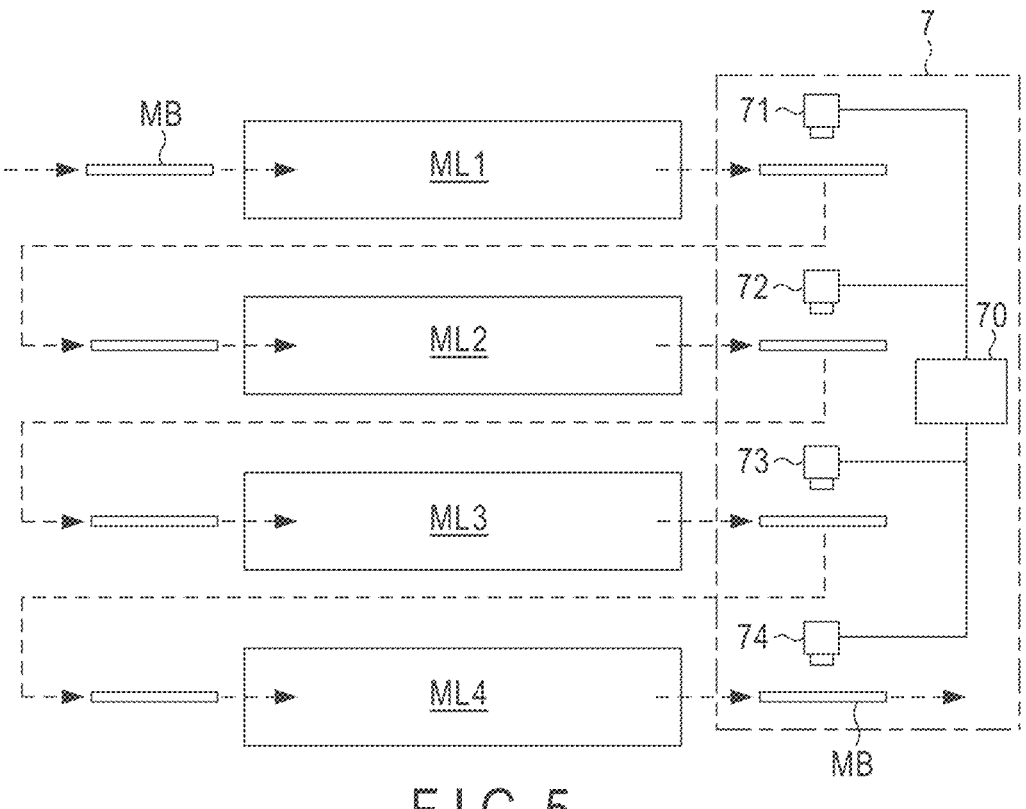
F I G. 5

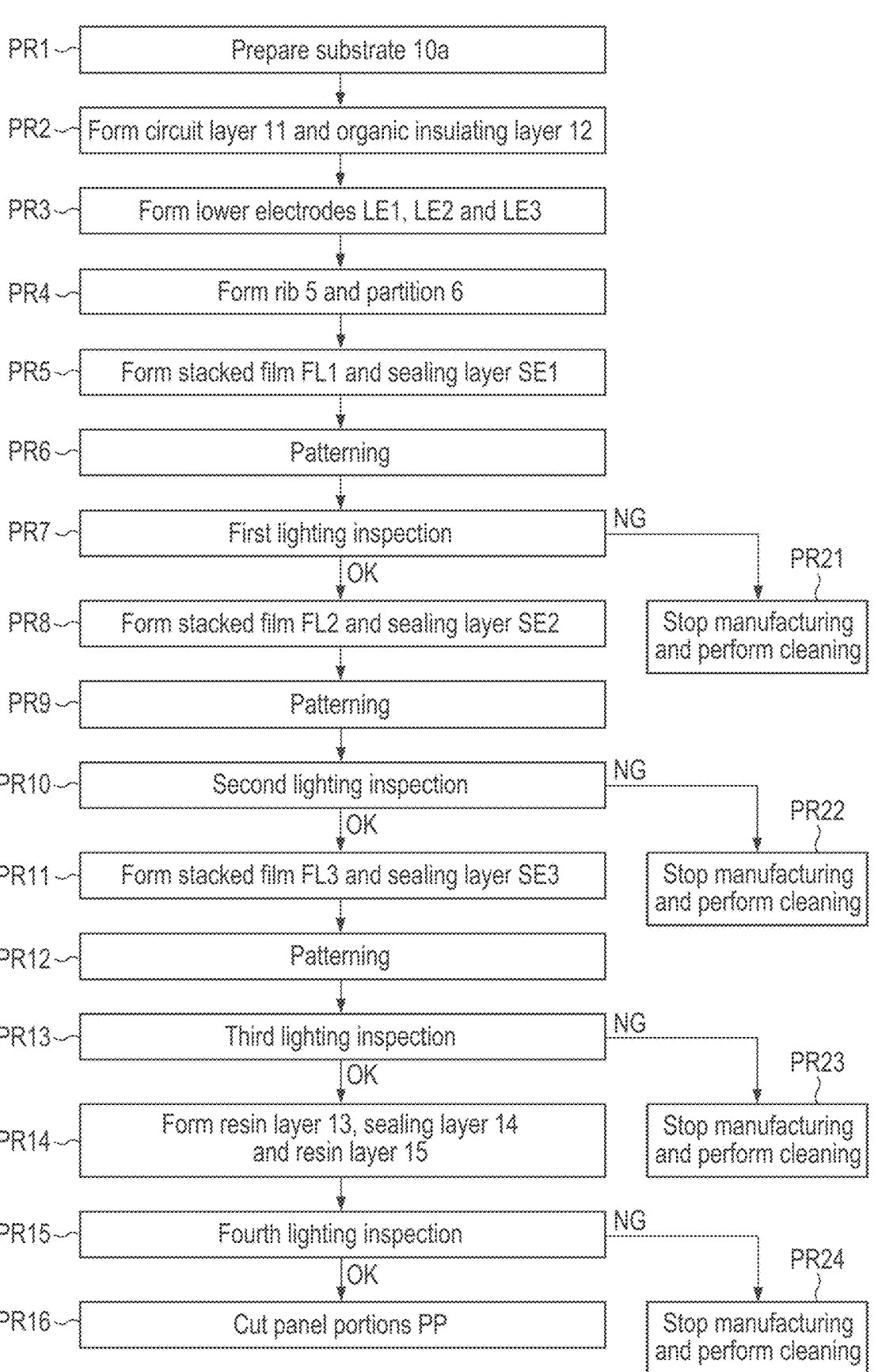
F I G. 6

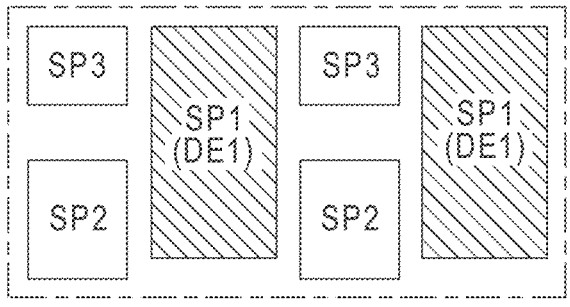
F I G. 11
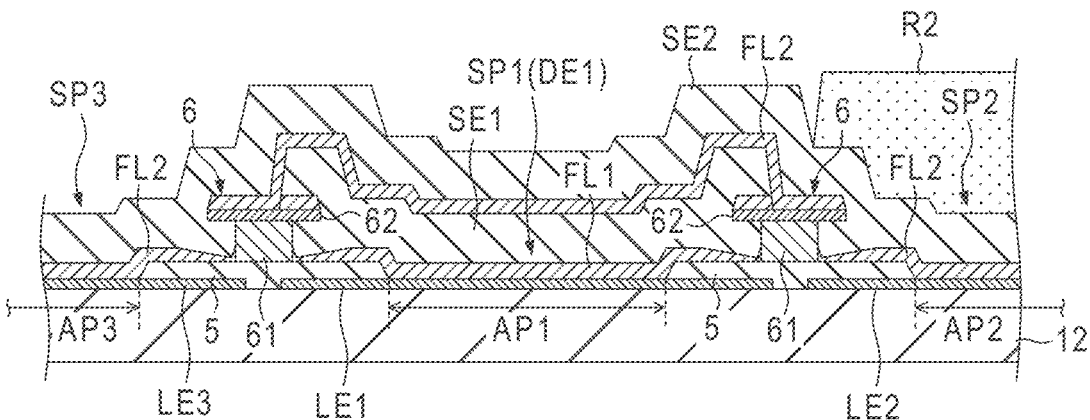
F I G. 12

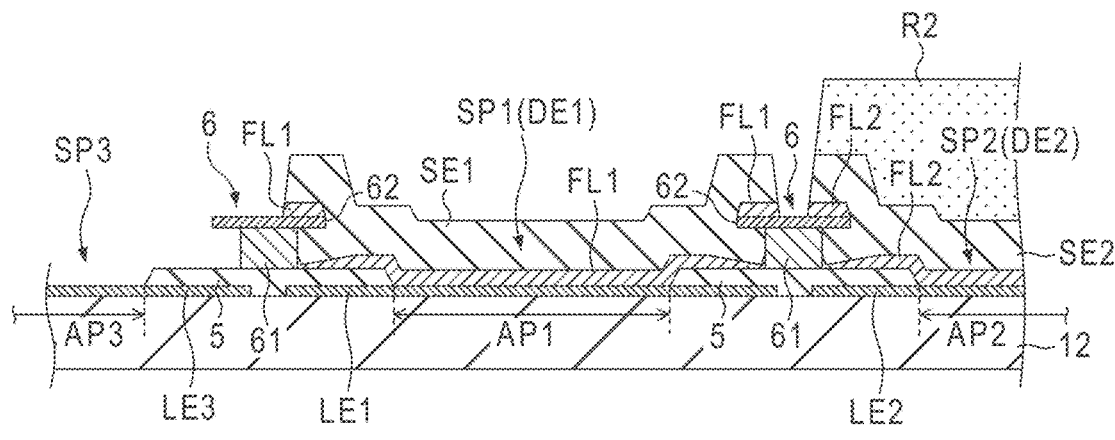
F I G. 13
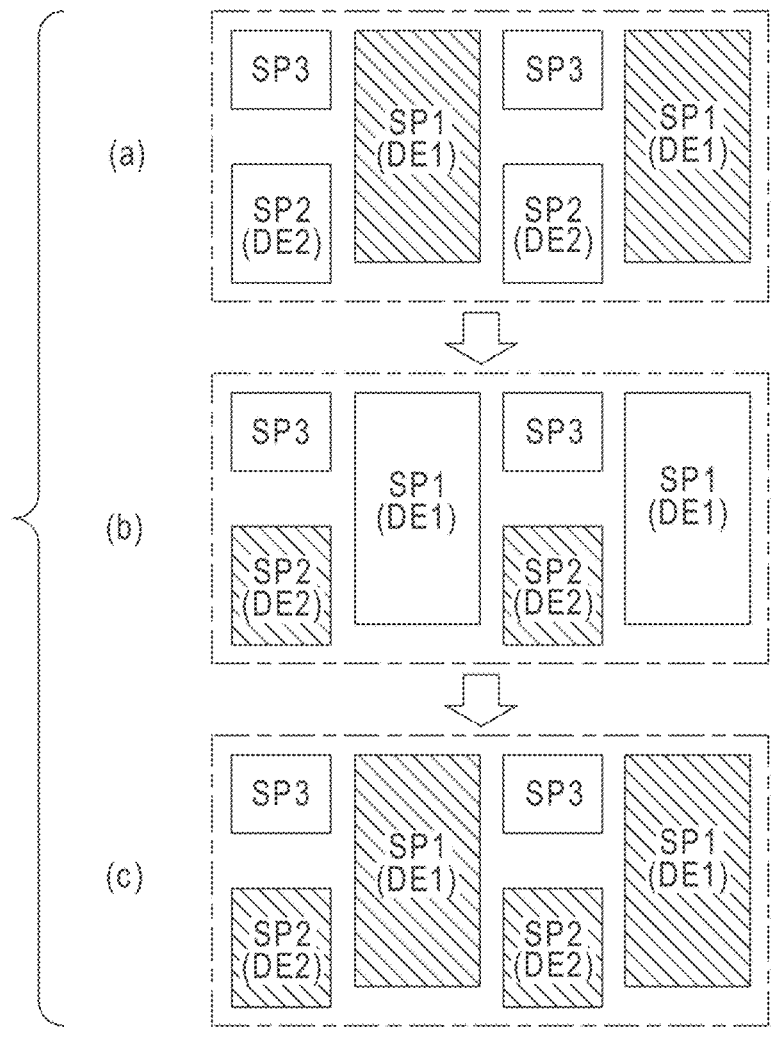
F I G. 14

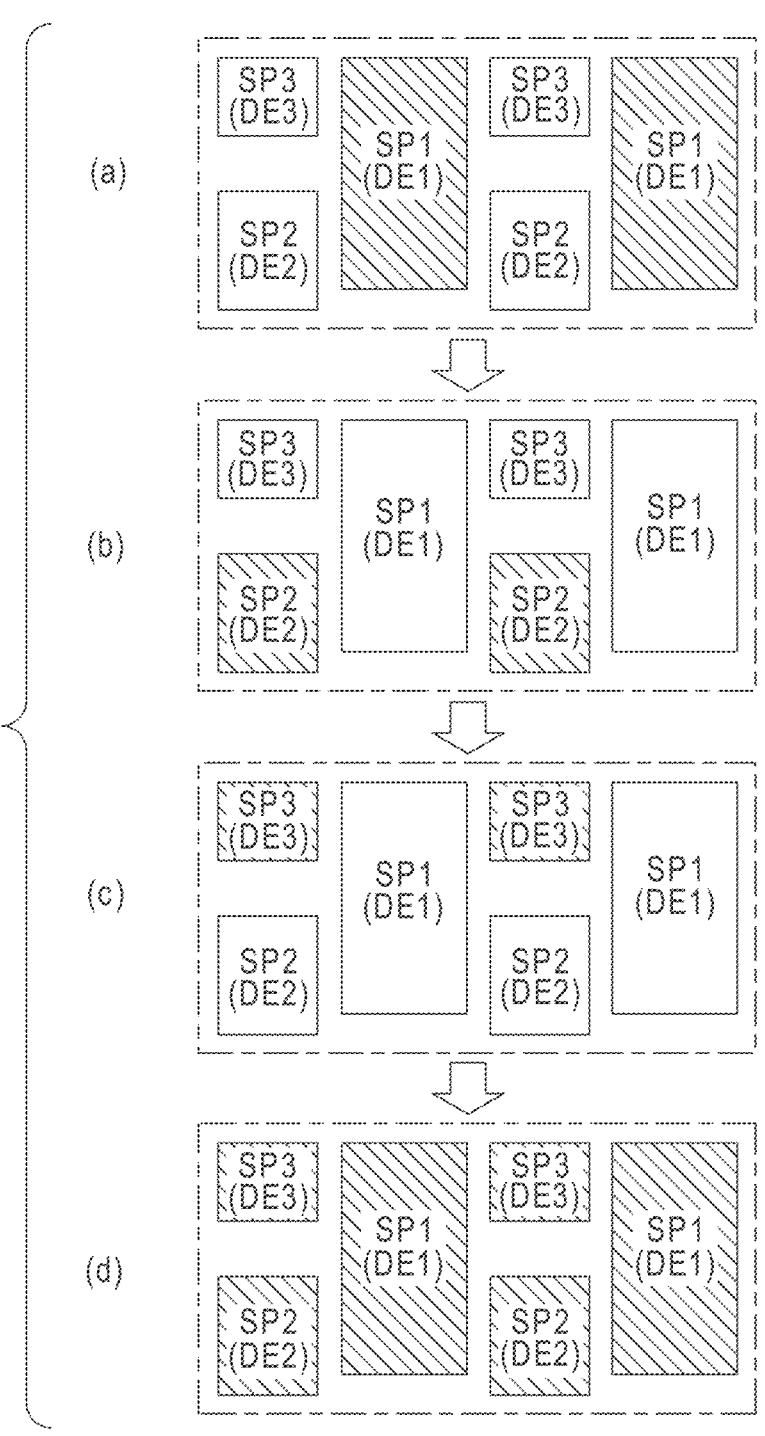
F I G. 17

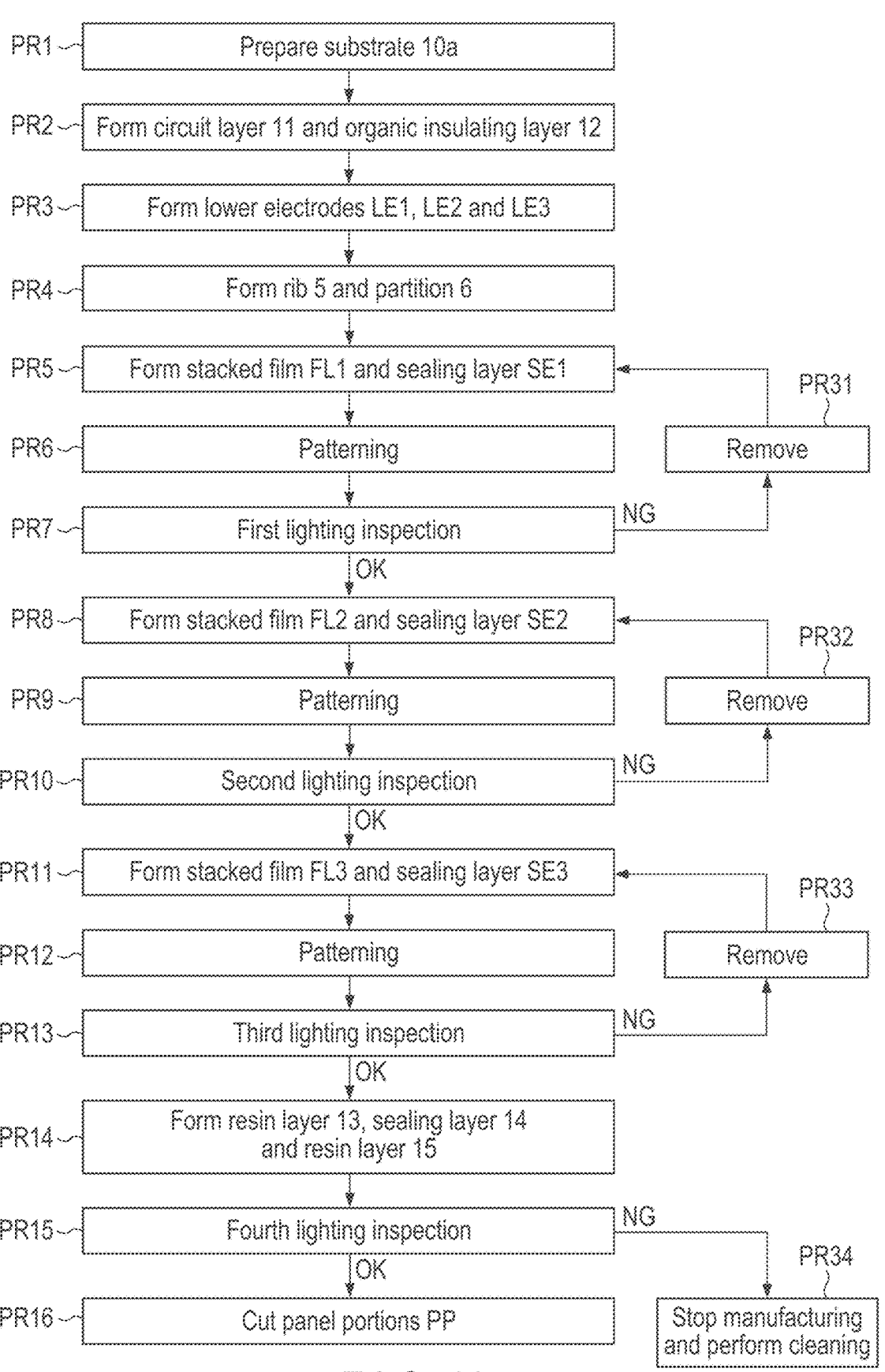
F I G. 18

MANUFACTURING METHOD OF DISPLAY DEVICE

CROSS-REFERENCE TO RELATED APPLICATION

This application is based upon and claims the benefit of priority from Japanese Patent Application No. 2023-021708, filed Feb. 15, 2023, the entire contents of which are incorporated herein by reference.

FIELD

Embodiments described herein relate generally to a manufacturing method of a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

Normally, in the manufacturing process of display devices, after all of a plurality of types of display elements which exhibit different colors are formed, lighting inspection of each display element is performed. In this case, when a defect is detected in a display element which exhibits a color in lighting inspection, the substrate which underwent the manufacturing process so far goes to waste.

BRIEF DESCRIPTION OF THE DRAWINGS

FIG. 4 is a schematic plan view of a mother substrate according to the first embodiment.

FIG. 5 is a diagram schematically showing the configuration of part of a manufacturing facility according to the first embodiment.

FIG. 6 is a flowchart showing an example of the manufacturing method of the display device according to the first embodiment.

FIG. 11 is a diagram schematically showing a process (first lighting inspection) following FIG. 10.

FIG. 12 is a diagram schematically showing a process following FIG. 11.

FIG. 13 is a diagram schematically showing a process following FIG. 12.

FIG. 14 is a diagram schematically showing a process (second lighting inspection) following FIG. 13.

FIG. 17 is a diagram schematically showing a process (third lighting inspection) following FIG. 16.

FIG. 18 is a flowchart showing an example of the manufacturing method of a display device according to a second embodiment.

DETAILED DESCRIPTION

Figure 1:
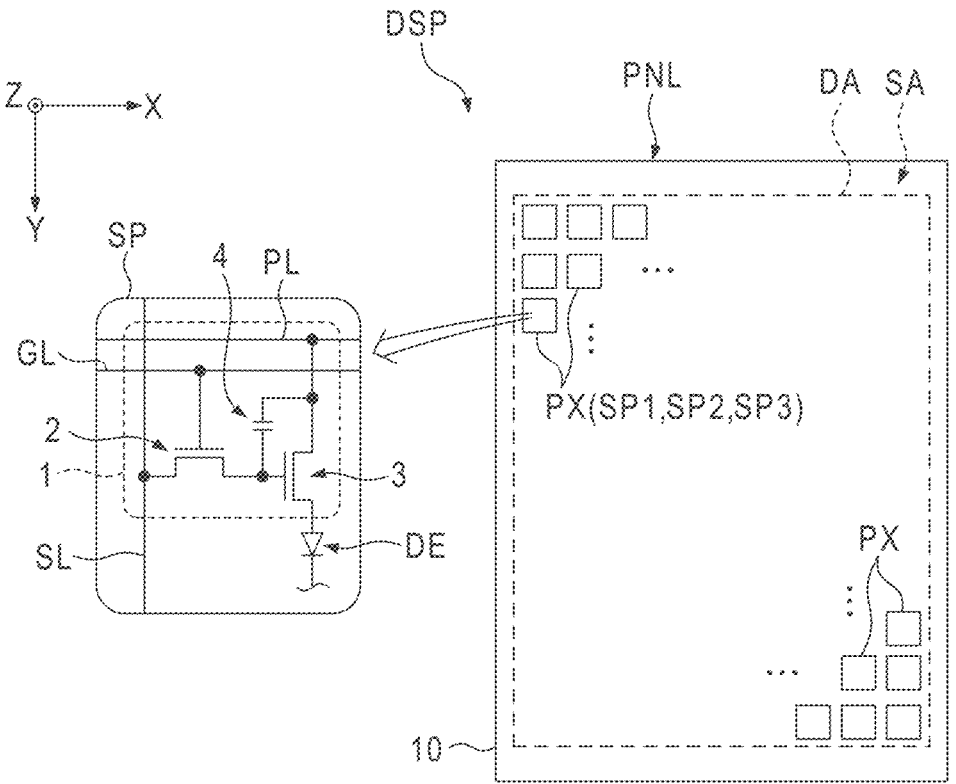
FIG. 1 is a diagram showing a configuration example of a display device according to a first embodiment.

In general, according to one embodiment, a manufacturing method of a display device is a method for manufacturing a display device including first, second and third display elements which emit light of different colors and includes preparing a substrate, forming the first display element on the substrate, and performing a first lighting inspection for causing the first display element to light up before forming the second display element and the third display element.

This configuration can improve the manufacturing yield of the display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The third direction Z is a normal direction relative to a plane including the first direction X and the second direction Y. When various elements are viewed parallel to the third direction Z, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

First Embodiment

FIG. 1 is a diagram showing a configuration example of a display device DSP according to a first embodiment. The display device DSP comprises a display panel PNL including an insulating substrate 10. The display panel PNL comprises a display area DA which displays an image, and a surrounding area SA around the display area DA. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
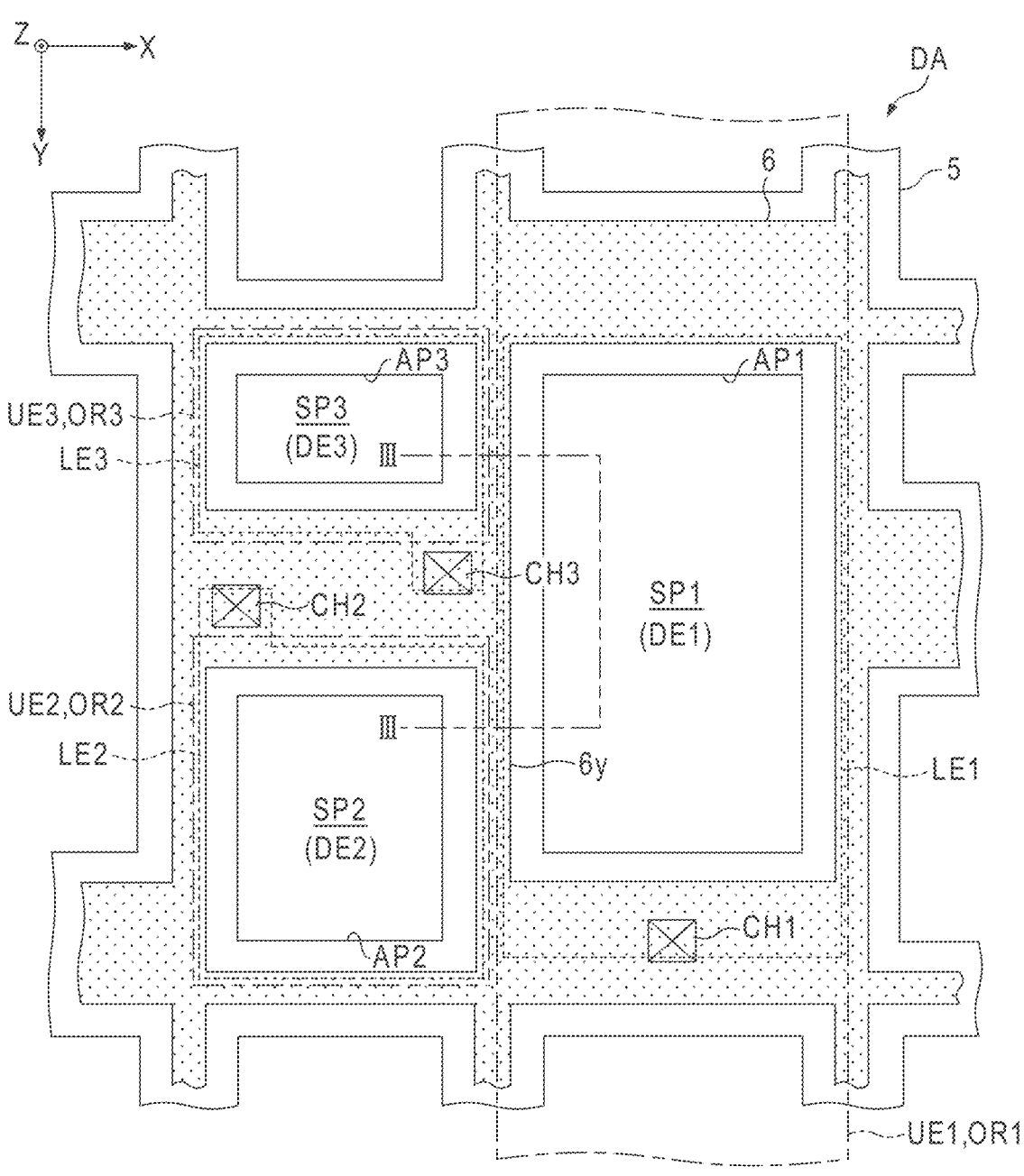
FIG. 2 is a schematic plan view showing an example of the layout of subpixels.

FIG. 2 is a schematic plan view showing an example of the layout of subpixels SP1, SP2 and SP3. In the example of FIG. 2, each of subpixels SP2 and SP3 is adjacent to subpixel SP1 in the first direction X. Further, subpixels SP2 and SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X. It should be noted that the layout of subpixels SP1, SP2 and SP3 is not limited to the example of FIG. 2.

A rib 5 is provided in the display area DA. The rib 5 comprises pixel apertures (first to third pixel apertures) AP1, AP2 and AP3 in subpixels SP1, SP2 and SP3, respectively. In the example of FIG. 2, the pixel aperture AP1 is larger than the pixel aperture AP2. The pixel aperture AP2 is larger than the pixel aperture AP3.

Subpixel SP1 comprises a lower electrode (first lower electrode) LE1, an upper electrode (first upper electrode) UE1 and an organic layer (first organic layer) OR1 overlapping the pixel aperture AP1. Subpixel SP2 comprises a lower electrode (second lower electrode) LE2, an upper electrode (second upper electrode) UE2 and an organic layer (second organic layer) OR2 overlapping the pixel aperture AP2. Subpixel SP3 comprises a lower electrode (third lower electrode) LE3, an upper electrode (third upper electrode) UE3 and an organic layer (third organic layer) OR3 overlapping the pixel aperture AP3.

Of the lower electrode LE1, the upper electrode UE1 and the organic layer OR1, the portions which overlap the pixel aperture AP1 constitute the display element (first display element) DE1 of subpixel SP1. Of the lower electrode LE2, the upper electrode UE2 and the organic layer OR2, the portions which overlap the pixel aperture AP2 constitute the display element (second display element) DE2 of subpixel SP2. Of the lower electrode LE3, the upper electrode UE3 and the organic layer OR3, the portions which overlap the pixel aperture AP3 constitute the display element (third display element) DE3 of subpixel SP3. Each of the display elements DE1, DE2 and DE3 may further include a cap layer and a sealing layer as described later. The rib 5 surrounds each of these display elements DE1, DE2 and DE3.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

A partition 6 is provided on the rib 5. The partition 6 overlaps the rib 5 as a whole and has the same planar shape as the rib 5. In other words, the partition 6 comprises an aperture in each of subpixels SP1, SP2 and SP3. From another viewpoint, the rib 5 and the partition 6 are provided between the display elements DE1, DE2 and DE3, and have grating shapes as seen in plan view.

Figure 3:
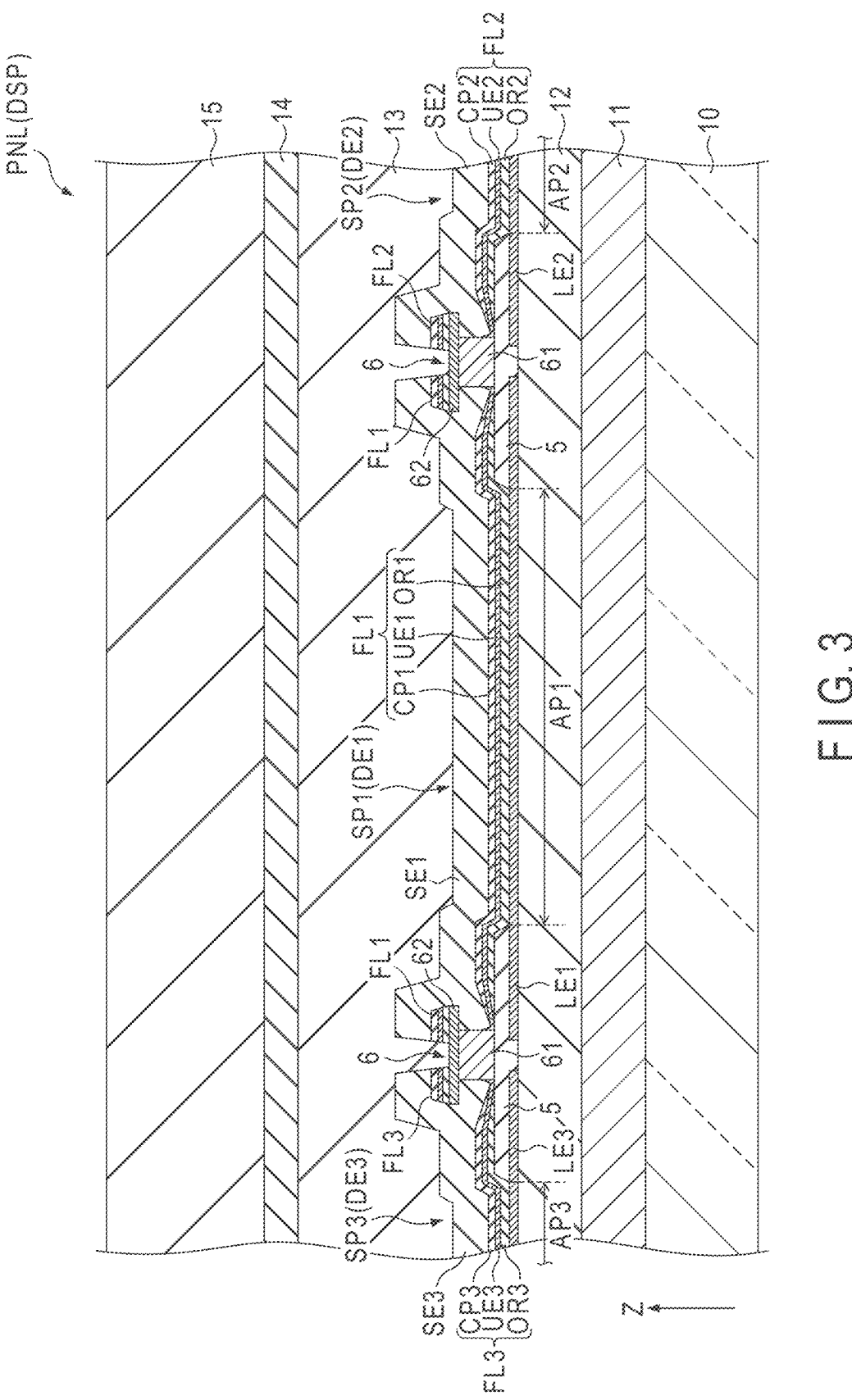
FIG. 3 is a schematic cross-sectional view of a display panel along the III-III line of FIG. 2.

FIG. 3 is a schematic cross-sectional view of the display panel PNL along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, the both end portions of the upper portion 62 protrude relative to the side surfaces of the lower portion 61. This shape of the partition 6 is called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. The upper electrodes UE1, UE2 and UE3 are in contact with the side surfaces of the lower portion 61 of the partition 6.

The display element DE1 includes a cap layer (first cap layer) CP1 provided on the upper electrode UE1. The display element DE2 includes a cap layer (second cap layer) CP2 provided on the upper electrode UE2. The display element DE3 includes a cap layer (third cap layer) CP3 provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a multilayer body including the organic layer OR1, the upper electrode UE1 and the cap layer CP1 is called a stacked film (first stacked film) FL1. A multilayer body including the organic layer OR2, the upper electrode UE2 and the cap layer CP2 is called a stacked film (second stacked film) FL2. A multilayer body including the organic layer OR3, the upper electrode UE3 and the cap layer CP3 is called a stacked film (third stacked film) FL3.

The stacked film FL1 is partly located on the upper portion 62. This portion is spaced apart from, of the stacked film FL1, the portion located under the partition 6 (in other words, the portion which constitutes the display element DE1). Similarly, the stacked film FL2 is partly located on the upper portion 62. This portion is spaced apart from, of the stacked film FL2, the portion located under the partition 6 (in other words, the portion which constitutes the display element DE2). Further, the stacked film FL3 is partly located on the upper portion 62. This portion is spaced apart from, of the stacked film FL3, the portion located under the partition 6 (in other words, the portion which constitutes the display element DE3).

The display element DE1 includes a sealing layer (first sealing layer) SE1. The display element DE2 includes a sealing layer (second sealing layer) SE2. The display element DE3 includes a sealing layer (third sealing layer) SE3. The sealing layer SE1 continuously covers the stacked film FL1 and the partition 6 around subpixel SP1. The sealing layer SE2 continuously covers the stacked film FL2 and the partition 6 around subpixel SP2. The sealing layer SE3 continuously covers the stacked film FL3 and the partition 6 around subpixel SP3.

In the example of FIG. 3, the stacked film FL1 and sealing layer SE1 located on the partition 6 between subpixels SP1 and SP2 are spaced apart from the stacked film FL2 and sealing layer SE2 located on this partition 6. The stacked film FL1 and sealing layer SE1 located on the partition 6 between subpixels SP1 and SP3 are spaced apart from the stacked film FL3 and sealing layer SE3 located on this partition 6.

The sealing layers SE1, SE2 and SE3 are covered with a resin layer 13. The resin layer 13 is covered with a sealing layer 14. The sealing layer 14 is covered with a resin layer 15. The resin layers 13 and 15 and the sealing layer 14 are continuously provided in at least the entire display area DA and partly extend in the surrounding area SA as well.

A cover member such as a polarizer, a touch panel, a protective film or a cover glass may be further provided above the resin layer 15. This cover member may be attached to the resin layer 15 via, for example, an adhesive layer such as an optical clear adhesive (OCA).

The organic insulating layer 12 is formed of an organic insulating material such as polyimide. Each of the rib 5 and the sealing layers 14, SE1, SE2 and SE3 is formed of an inorganic insulating material such as silicon nitride (SiNx), silicon oxide (SiOx), silicon oxynitride (SiON) or aluminum oxide ($Al_2O_3$). For example, the rib 5 is formed of silicon oxynitride, and each of the sealing layers 14, SE1, SE2 and SE3 is formed of silicon nitride. Each of the resin layers 13 and 15 is formed of, for example, a resinous material (organic insulating material) such as epoxy resin or acrylic resin.

Each of the lower electrodes LE1, LE2 and LE3 comprises a reflective layer formed of, for example, silver (Ag), and a pair of conductive oxide layers covering the upper and lower surfaces of the reflective layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers.

Each of the cap layers CP1, CP2 and CP3 comprises, for example, a multilayer structure in which a plurality of transparent thin films are stacked. The thin films may include a thin film formed of an inorganic material and a thin film formed of an organic material. These thin films have refractive indices different from each other. For example, the refractive indices of these thin films are different from the refractive indices of the upper electrodes UE1, UE2 and UE3 and the refractive indices of the sealing layers SE1, SE2 and SE3. It should be noted that at least one of the cap layers CP1, CP2 and CP3 may be omitted.

The lower portion 61 of the partition 6 is formed of, for example, aluminum. The lower portion 61 may be formed of an aluminum alloy such as an aluminum-neodymium alloy (AlNd), an aluminum-yttrium alloy (AlY) or an aluminum-silicon alloy (AlSi), or may comprise a multilayer structure consisting of an aluminum layer and an aluminum alloy layer. Further, the lower portion 61 may comprise a bottom layer formed of a metal material different from aluminum and an aluminum alloy under the aluminum layer or the aluminum alloy layer. For the metal material forming the bottom layer, for example, molybdenum (Mo), titanium nitride (TiN), a molybdenum-tungsten alloy (MoW) or a molybdenum-niobium alloy (MoNb) may be used.

For example, the upper portion 62 of the partition 6 comprises a multilayer structure consisting of a lower layer formed of a metal material and an upper layer formed of conductive oxide. For the metal material forming the lower layer, for example, titanium, titanium nitride, molybdenum, tungsten, a molybdenum-tungsten alloy or a molybdenum-niobium alloy may be used. For the conductive oxide forming the upper layer, for example, ITO or IZO may be used. It should be noted that the upper portion 62 may comprise a single-layer structure of a metal material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

When the display device DSP is manufactured, a large mother substrate in which a plurality of areas (panel portions) each corresponding to the display panel PNL are formed is prepared. A configuration which could be applied to this mother substrate is explained below.

FIG. 4 is a schematic plan view of a mother substrate MB (a mother substrate for a display device) according to the embodiment. The mother substrate MB comprises an insulating substrate 10a which is a base. In the example of FIG. 4, the substrate 10a is rectangular. However, the shape is not limited to this example.

The substrate 10a comprises a plurality of panel portions PP arranged in matrix. The outer shape of each panel portion PP corresponds to a cut line for cutting the panel portion PP from the mother substrate MB. Each panel portion PP comprises the display area DA and surrounding area SA described above.

Now, this specification explains the manufacturing facility and manufacturing method of the mother substrate MB and the display device DSP. In the embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

FIG. 5 is a diagram schematically showing the configuration of part of the manufacturing facility. The manufacturing facility comprises manufacturing lines ML1, ML2, ML3 and ML4 and an inspection device 7. The manufacturing line ML1 forms the stacked film FL1 and the sealing layer SE1. The manufacturing line FL2 forms the stacked film FL2 and the sealing layer SE2. The manufacturing line ML3 forms the stacked film FL3 and the sealing layer SE3. The manufacturing line ML4 forms the resin layer 13, the sealing layer 14 and the resin layer 15. Each of the manufacturing lines ML1, ML2, ML3 and ML4 includes a plurality of evaporation devices for forming various elements, a chemical vapor deposition (CVD) device, etc. These evaporation devices, CVD device and the like include a chamber maintained as a vacuum.

In the figure, the dashed arrows show the conveyance path of the mother substrate MB. The mother substrate MB is conveyed through the manufacturing lines ML1, ML2, ML3 and ML4 in order. In FIG. 5, manufacturing lines for performing the process prior to the manufacturing line ML1 and manufacturing lines for performing the process subsequent to the manufacturing line ML4 are omitted.

The inspection device 7 performs the lighting inspection of the display elements DE1, DE2 and DE3 formed in the mother substrate MB. In the example of FIG. 5, the inspection device 7 comprises a controller 70 and cameras 71, 72, 73 and 74. The camera 71 captures an image of the mother substrate MB which underwent the manufacturing line ML1. The camera 72 captures an image of the mother substrate MB which underwent the manufacturing line ML2. The camera 73 captures an image of the mother substrate MB which underwent the manufacturing line ML3. The camera 74 captures an image of the mother substrate MB which underwent the manufacturing line ML4. The images captured by the cameras 71, 72, 73 and 74 may be color images or monochromatic images.

The controller 70 causes the cameras 71, 72, 73 and 74 to capture an image of the mother substrate MB in which at least one of the display elements DE1, DE2 and DE3 lights up. Further, the controller 70 detects a lighting defect based on the images captured by the cameras 71, 72, 73 and 74.

It should be noted that the number of cameras provided in the inspection device 7 is not limited to four. For example, the inspection device 7 may comprise only one camera. In this case, the conveyance path of the mother substrate MB may be set such that the mother substrate MB which underwent each of the manufacturing lines ML1, ML2, ML3 and ML4 is conveyed to the capture position of the camera.

FIG. 6 is a flowchart showing an example of the manufacturing method of the display device DSP. Each of FIG. 7 to FIG. 17 is a diagram showing a process of the manufacturing method. To manufacture the display device DSP, first, a large substrate 10a including areas corresponding to a plurality of panel portions PP is prepared (process PR1). Subsequently, the circuit layer 11 and the organic insulating layer 12 are formed on the substrate 10a (process PR2).

After process PR2, the lower electrodes LE1, LE2 and LE3 are formed (process PR3). Further, the rib 5 and the partition 6 are formed (process PR4). The flow of process PR4 is as shown in FIG. 7 and FIG. 8.

Figure 7:
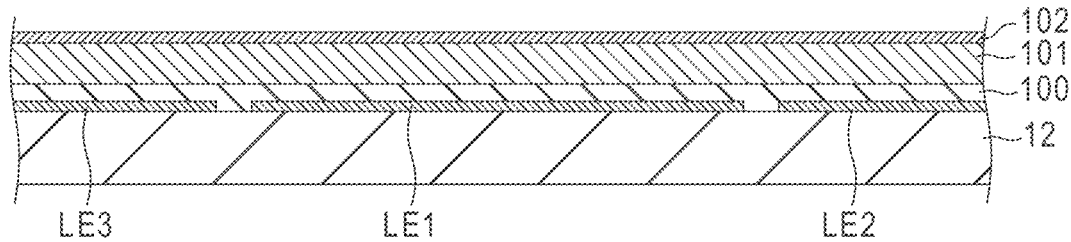
FIG. 7 is a diagram showing a process of the manufacturing method of the display device according to the first embodiment.

Specifically, first, as shown in FIG. 7, an inorganic insulating layer 100 which should be processed into the rib 5 is formed in the entire mother substrate MB. Further, a first layer 101 which should be processed into the lower portion 61 is formed on the inorganic insulating layer 100. A second layer 102 which should be processed into the upper portion 62 is formed on the first layer 101.

Figure 8:
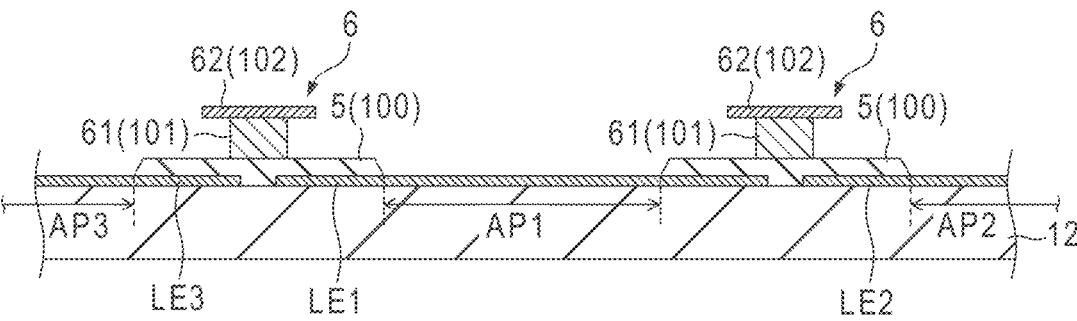
FIG. 8 is a diagram schematically showing a process following FIG. 7.

Subsequently, as shown in FIG. 8, the first layer 101 and the second layer 102 are patterned. This patterning includes etching for processing the second layer 102 into the shape of the upper portion 62 and etching for processing the first layer 101 into the shape of the lower portion 61. By these etching processes, the partition 6 including the lower portion 61 and the upper portion 62 is formed in the display area DA.

After the formation of the partition 6, as shown in FIG. 8, the pixel apertures AP1, AP2 and AP3 are formed in the inorganic insulating layer 100. By this process, the rib 5 is formed in the display area DA. FIG. 7 and FIG. 8 show a case where the pixel apertures AP1, AP2 and AP3 are formed after the formation of the partition 6. As another example, the partition 6 may be formed after the formation of the pixel apertures AP1, AP2 and AP3.

Figure 9:
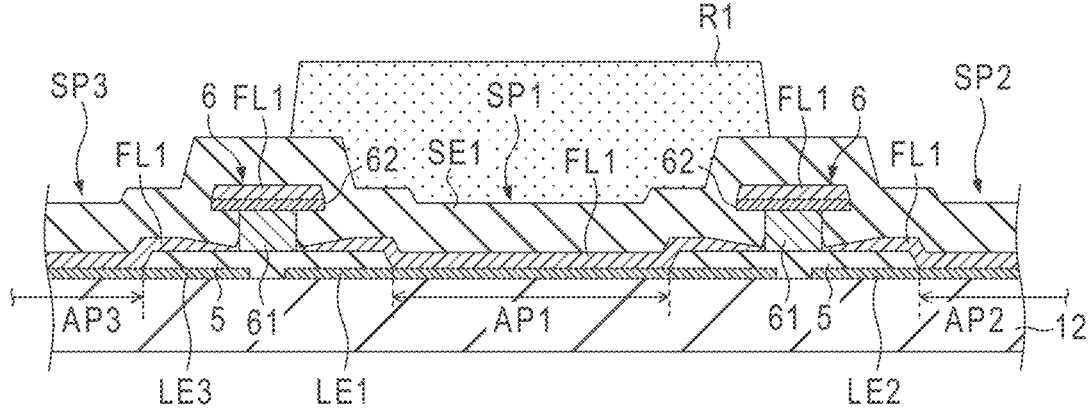
FIG. 9 is a diagram schematically showing a process following FIG. 8.

After the formation of the rib 5 and the partition 6, the mother substrate MB is conveyed to the manufacturing line ML1, and a process for forming the display element DE1 is performed. To form the display element DE1, first, as shown in FIG. 9, the stacked film FL1 and the sealing layer SE1 are formed (process PR5). The stacked film FL1 includes, as shown in FIG. 3, the organic layer OR1 which is in contact with the lower electrode LE1 through the pixel aperture AP1, the upper electrode UE1 which covers the organic layer OR1 and the cap layer CP1 which covers the upper electrode UE1. The organic layer OR1, the upper electrode UE1 and the cap layer CP1 are formed by vapor deposition. The sealing layer SE1 is formed by CVD.

The stacked film FL1 is divided into a plurality of portions by the partition 6 having an overhang shape. The stacked film FL1 covers the lower electrodes LE1, LE2 and LE3 exposed through the pixel apertures AP1, AP2 and AP3, the rib 5 and the partition 6. The sealing layer SE1 continuously covers the divided portions of the stacked film FL1 and the partition 6.

After process PR5, the stacked film FL1 and the sealing layer SE1 are patterned (process PR6). In this patterning, as shown in FIG. 9, a resist R1 is provided on the sealing layer SE1. The resist R1 covers subpixel SP1 and part of the partition 6 around the subpixel.

Figure 10:
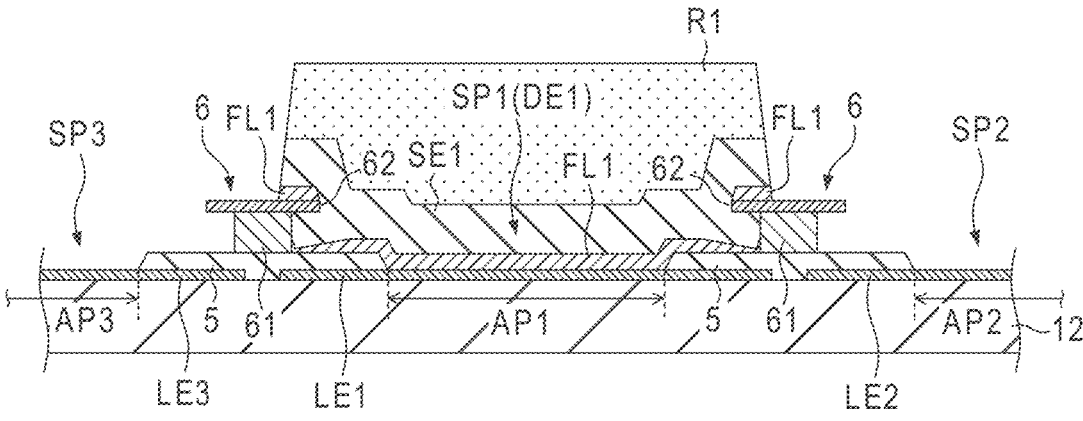
FIG. 10 is a diagram schematically showing a process following FIG. 9.

Subsequently, as shown in FIG. 10, the portions of the stacked film FL1 and the sealing layer SE1 exposed from the resist R1 are removed by etching using the resist R1 as a mask. In other words, of the stacked film FL1 and the sealing layer SE1, the portions which overlap the lower electrode LE1 remain, and the other portions are removed. By this process, the display element DE1 is formed in subpixel SP1. For example, this etching includes dry etching and wet etching processes which are performed in order for the sealing layer SE1, the cap layer CP1, the upper electrode UE1 and the organic layer OR1. After this etching, the resist R1 is removed.

In each panel portion PP of the mother substrate MB which underwent the above process PR6, the display element DE1 is formed in subpixel SP1, and neither the display element DE2 nor the display element DE3 is formed in subpixel SP2 or subpixel SP3. In each display element DE1, the stacked film FL1 is formed in an area surrounded by the partition 6 which overlaps the end portion of the lower electrode LE1. Further, the sealing layer SE1 continuously covers the stacked film FL1 and the partition 6 around the stacked film FL1.

After process PR6, a first lighting inspection is performed by the inspection device 7 (process PR7). When the first lighting inspection is performed, the mother substrate MB which underwent the manufacturing line ML1 is provided in the air. Further, a terminal provided in the mother substrate MB for inspection is electrically connected to the inspection device 7.

FIG. 11 is a plan view showing an example of the first lighting inspection and shows part of the display area DA. The shaded portions shown in FIG. 11 indicate areas which light up in the first lighting inspection. Thus, the controller 70 of the inspection device 7 causes all of the display elements DE1 included in the display area DA to simultaneously light up. Further, the controller 70 causes the camera 71 to capture an image of the display area DA in a state where the display elements DE1 light up.

Subsequently, the controller 70 determines whether or not a defect is present regarding a plurality of predetermined inspection items based on the image captured by the camera 71. For example, as the inspection items, the non-uniformity in luminance in the entire display area DA, a defect in the luminance and color chromaticity of each display element DE1 and a pixel defect and line defect in the display area DA are considered. A pixel defect indicates that a display element (in the first lighting inspection, a display element DE1) which does not light up at any time or lights up with a higher luminance than the surrounding area at all times is present. A line defect indicates that a display defect is generated in a plurality of display elements (in the first lighting inspection, display elements DE1) which are linearly arranged.

The condition for determining that a defect is present regarding each inspection item is set in advance and stored in a memory of the controller 70. For example, as the condition regarding a pixel defect, the threshold to be compared with the number of pixels having a defect in the display area DA in the image can be used. Regarding the other inspection items, similarly, the thresholds to be compared with the values obtained from the image may be determined as the conditions for the determination of defects.

The first lighting inspection may be performed at the same time for all of the panel portions PP provided in the mother substrate MB. As another example, in the first lighting inspection, the panel portions PP provided in the mother substrate MB may be divided into some groups, and the first lighting inspection may be performed for each of these groups.

When a defect is detected regarding an inspection item in the first lighting inspection (NG in process PR7), the manufacturing facility is stopped (process PR21). For example, the mother substrate MB in which a defect has been detected is discarded without going through the subsequent process. Cleaning is performed for part of or all of the chambers included in the manufacturing line ML1.

When a defect is not detected for any inspection item in the first lighting inspection (OK in process PR7), the mother substrate MB is conveyed to the manufacturing line ML2, and a process for forming the display element DE2 is performed.

The display element DE2 is formed by a procedure similar to that of the display element DE1. Specifically, to form the display element DE2, first, as shown in FIG. 12, the stacked film FL2 and the sealing layer SE2 are formed (process PR8). The stacked film FL2 includes, as shown in FIG. 3, the organic layer OR2 which is in contact with the lower electrode LE2 through the pixel aperture AP2, the upper electrode UE2 which covers the organic layer OR2 and the cap layer CP2 which covers the upper electrode UE2. The organic layer OR2, the upper electrode UE2 and the cap layer CP2 are formed by vapor deposition. The sealing layer SE2 is formed by CVD. The stacked film FL2 is divided into a plurality of portions by the partition 6 having an overhang shape. The sealing layer SE2 continuously covers the divided portions of the stacked film FL2 and the partition 6.

After process PR8, the stacked film FL2 and the sealing layer SE2 are patterned (process PR9). In this patterning, as shown in FIG. 12, a resist R2 is provided on the sealing layer SE2. The resist R2 covers subpixel SP2 and part of the partition 6 around the subpixel.

Subsequently, as shown in FIG. 13, the portions of the stacked film FL2 and the sealing layer SE2 exposed from the resist R2 are removed by etching using the resist R2 as a mask. By this process, the display element DE2 is formed in subpixel SP2.

After process PR9, a second lighting inspection is performed by the inspection device 7 (process PR10). When the second lighting inspection is performed, the mother substrate MB which underwent the manufacturing line ML2 is provided in the air. Further, the terminal provided in the mother substrate MB for inspection is electrically connected to the inspection device 7.

FIG. 14 is a plan view showing an example of the second lighting inspection and shows part of the display area DA. The shaded portions shown in FIG. 14 indicate areas which light up in the second lighting inspection. Thus, as shown in FIG. 14(a), the controller 70 of the inspection device 7 causes all of the display elements DE1 included in the display area DA to simultaneously light up, and causes the camera 72 to capture an image of the display area DA in a state where the display elements DE1 light up.

Subsequently, as shown in FIG. 14(*b*), the controller 70 causes all of the display elements DE2 included in the display area DA to simultaneously light up, and causes the camera 72 to capture an image of the display area DA in a state where the display elements DE2 light up.

Further, as shown in FIG. 14(*c*), the controller 70 causes all of the display elements DE1 and all of the display elements DE2 included in the display area DA to simultaneously light up, and causes the camera 72 to capture an image of the display area DA in a state where the display elements DE1 and DE2 light up.

Subsequently, the controller 70 determines whether or not a defect is present regarding a plurality of predetermined inspection items based on each image captured by the camera 72. The inspection items of the second lighting inspection are, for example, the same as the first lighting inspection. Different inspection items or different conditions for the determination of detects may be determined for the images obtained in FIG. 14(*a*), FIG. 14(*b*) and FIG. 14(*c*).

The second lighting inspection may be performed at the same time for all of the panel portions PP provided in the mother substrate MB. As another example, in the second lighting inspection, the panel portions PP provided in the mother substrate MB may be divided into some groups, and the second lighting inspection may be performed for each of these groups.

When a defect is detected regarding an inspection item in the second lighting inspection (NG in process PR10), the manufacturing facility is stopped (process PR22). For example, the mother substrate MB in which a defect has been detected is discarded without going through the subsequent process. Cleaning is performed for part of or all of the chambers included in the manufacturing line ML2.

When a defect is not detected for any inspection item in the second lighting inspection (OK in process PR10), the mother substrate MB is conveyed to the manufacturing line ML3, and a process for forming the display element DE3 is performed.

Figure 15:
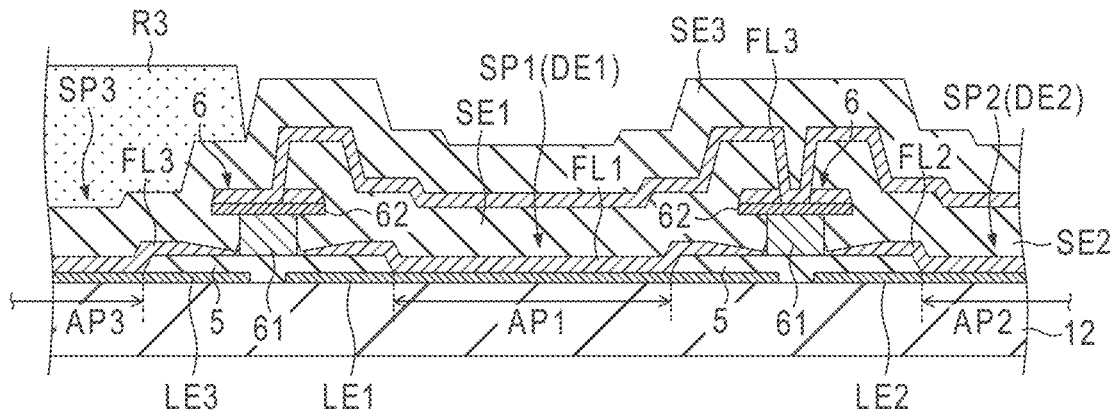
FIG. 15 is a diagram schematically showing a process following FIG. 14.

The display element DE3 is formed by a procedure similar to the procedures of the display elements DE1 and DE2. Specifically, to form the display element DE3, first, as shown in FIG. 15, the stacked film FL3 and the sealing layer SE3 are formed (process PR11). The stacked film FL3 includes, as shown in FIG. 3, the organic layer OR3 which is in contact with the lower electrode LE3 through the pixel aperture AP3, the upper electrode UE3 which covers the organic layer OR3 and the cap layer CP3 which covers the upper electrode UE3. The organic layer OR3, the upper electrode UE3 and the cap layer CP3 are formed by vapor deposition. The sealing layer SE3 is formed by CVD. The stacked film FL3 is divided into a plurality of portions by the partition 6 having an overhang shape. The sealing layer SE3 continuously covers the divided portions of the stacked film FL3 and the partition 6.

After process PR11, the stacked film FL3 and the sealing layer SE3 are patterned (process PR12). In this patterning, as shown in FIG. 15, a resist R3 is provided on the sealing layer SE3. The resist R3 covers subpixel SP3 and part of the partition 6 around the subpixel.

Figure 16:
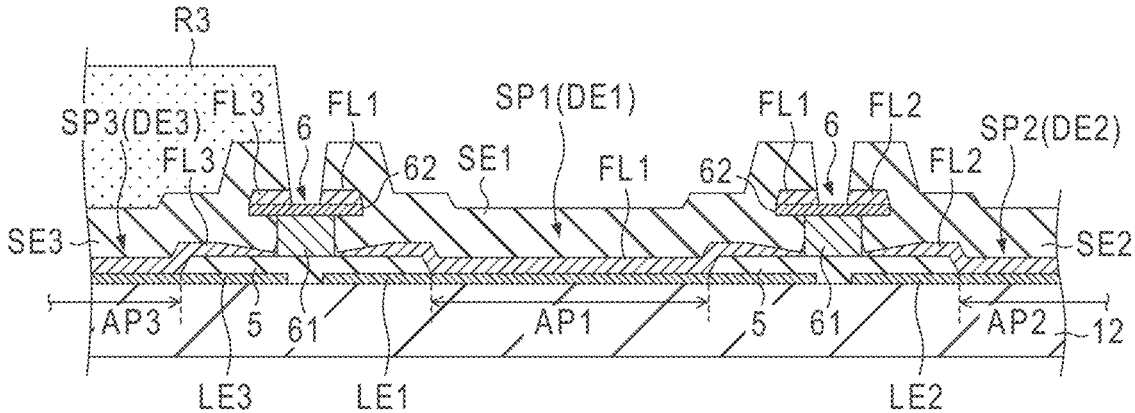
FIG. 16 is a diagram schematically showing a process following FIG. 15.

Subsequently, as shown in FIG. 16, the portions of the stacked film FL3 and the sealing layer SE3 exposed from the resist R3 are removed by etching using the resist R3 as a mask. By this process, the display element DE3 is formed in subpixel SP3.

After process PR12, a third lighting inspection is performed by the inspection device 7 (process PR13). When the third lighting inspection is performed, the mother substrate MB which underwent the manufacturing line ML3 is provided in the air. Further, the terminal provided in the mother substrate MB for inspection is electrically connected to the inspection device 7.

FIG. 17 is a plan view showing an example of the third lighting inspection and shows part of the display area DA. The shaded portions shown in FIG. 17 indicate areas which light up in the third lighting inspection. Thus, as shown in FIG. 17(*a*), the controller 70 of the inspection device 7 causes all of the display elements DE1 included in the display area DA to simultaneously light up, and causes the camera 73 to capture an image of the display area DA in a state where the display elements DE1 light up.

Subsequently, as shown in FIG. 17(*b*), the controller 70 causes all of the display elements DE2 included in the display area DA to simultaneously light up, and causes the camera 73 to capture an image of the display area DA in a state where the display elements DE2 light up.

Subsequently, as shown in FIG. 17(*c*), the controller 70 causes all of the display elements DE3 included in the display area DA to simultaneously light up, and causes the camera 73 to capture an image of the display area DA in a state where the display elements DE3 light up.

Further, as shown in FIG. 17(*d*), the controller 70 causes all of the display elements DE1, DE2 and DE3 included in the display area DA to simultaneously light up, and causes the camera 73 to capture an image of the display area DA in a state where the display elements DE1, DE2 and DE3 light up.

Subsequently, the controller 70 determines whether or not a defect is present regarding a plurality of predetermined inspection items based on each image captured by the camera 73. The inspection items of the third lighting inspection are, for example, the same as the first and second lighting inspections. Different inspection items or different conditions for the determination of detects may be determined for the images obtained in FIG. 17(*a*), FIG. 17(*b*), FIG. 17(*c*) and FIG. 17 (*d*).

The third lighting inspection may be performed at the same time for all of the panel portions PP provided in the mother substrate MB. As another example, in the third lighting inspection, the panel portions PP provided in the mother substrate MB may be divided into some groups, and the third lighting inspection may be performed for each of these groups.

When a defect is detected regarding an inspection item in the third lighting inspection (NG in process PR13), the manufacturing facility is stopped (process PR23). For example, the mother substrate MB in which a defect has been detected is discarded without going through the subsequent process. Cleaning is performed for part of or all of the chambers included in the manufacturing line ML3.

When a defect is not detected for any inspection item in the third lighting inspection (OK in process PR13), the mother substrate MB is conveyed to the manufacturing line ML4, and the resin layer 13, sealing layer 14 and resin layer 15 shown in FIG. 3 are formed in order (process PR14). Further, the mother substrate MB which underwent the manufacturing line ML4 is provided in the air, and a fourth lighting inspection is performed (process PR15).

The flow of the fourth lighting inspection is, for example, the same as the third lighting inspection shown in FIG. 17. When a defect is detected regarding an inspection item in the fourth lighting inspection (NG in process PR15), the manufacturing facility is stopped (process PR24). For example, the mother substrate MB in which a defect has been detected is discarded without going through the subsequent process.

Cleaning is performed for part of or all of the chambers included in the manufacturing line ML4.

When a defect is not detected for any inspection item in the fourth lighting inspection (OK in process PR15), each panel portion PP is cut out from the mother substrate MB (process PR16). Each of the panel portions PP which have been cut out corresponds to the display panel PNL.

As described above, in the embodiment, the first to fourth lighting inspections are performed for the display device DSP (mother substrate MB) in the middle of manufacturing. As a comparative example of the embodiment, a lighting inspection (fourth lighting inspection) may be performed for only the mother substrate MB immediately before the panel portions PP are cut. However, in this case, for example, even if a defect is generated in the process of forming the display element DE1, the defect can be detected only after the formation of the other elements such as the display elements DE2 and DE3.

To the contrary, if the first lighting inspection is performed immediately after the formation of the display element DE1 as in the case of the embodiment, manufacturing can be stopped so as not to uselessly perform the process of forming the display element DE2 or DE3.

In the embodiment, the stacked film FL1 of the display element DE1 is sealed by the sealing layer SE1 before the formation of the display elements DE2 and DE3. If the stacked film FL1 is not sealed until the formation of the display elements DE2 and DE3, to prevent moisture from entering the stacked film FL1, the mother substrate MB should undergo a lighting inspection in a vacuum environment. To the contrary, in the configuration of the display element DE1 of the embodiment, a lighting inspection can be performed in the air. In this manner, the configuration of the manufacturing facility for lighting inspection can be simplified.

In the embodiment, the second lighting inspection is performed immediately after the formation of the display element DE2, and the third lighting inspection is performed immediately after the formation of the display element DE3. Thus, effects similar to those explained regarding the display element DE1 are obtained for the display elements DE2 and DE3.

Second Embodiment

A second embodiment is explained. The configurations or effects which are not particularly referred to are the same as the first embodiment.

FIG. 18 is a flowchart showing an example of the manufacturing method of a display device DSP according to the second embodiment. Process PR1 to process PR16 are the same as the first embodiment (see FIG. 6). In this embodiment, instead of processes PR21, PR22 and PR23 shown in FIG. 6, processes PR31, PR32 and PR33 are performed.

Specifically, when a defect is detected regarding an inspection item in a first lighting inspection (NG in process PR7), a sealing layer SE1 and a stacked film FL1 are removed from a mother substrate MB (process PR31). This process includes dry etching and wet etching for removing the sealing layer SE1 and the stacked film FL1 in series.

After process PR31, processes PR5 to PR7 are performed again. Specifically, a sealing layer SE1 and a stacked film FL1 are formed in the mother substrate MB. A display element DE1 is formed again by patterning these sealing layer SE1 and stacked film FL1. Further, the first lighting inspection is performed again. After process PR31, part of or all of the chambers included in a manufacturing line ML1 may be cleaned before process PR5 is performed again.

In a second lighting inspection, similarly, when a defect is detected regarding an inspection item (NG in process PR10), a sealing layer SE2 and a stacked film FL2 are removed from the mother substrate MB (process PR32). For example, process PR32 includes a process for covering the display element DE1 with a resist and removing the sealing layer SE2 and the stacked film FL2 in series by dry etching and wet etching.

After process PR32, processes PR8 to PR10 are performed again. Specifically, a sealing layer SE2 and a stacked film FL2 are formed in the mother substrate MB. A display element DE2 is formed again by patterning these sealing layer SE2 and stacked film FL2. Further, the second lighting inspection is performed again. After process PR32, part of or all of the chambers included in a manufacturing line ML2 may be cleaned before process PR8 is performed again.

In a third lighting inspection, similarly, when a defect is detected regarding an inspection item (NG in process PR13), a sealing layer SE3 and a stacked film FL3 are removed from the mother substrate MB (process PR33). For example, process PR13 includes a process for covering the display elements DE1 and DE2 with a resist and removing the sealing layer SE3 and the stacked film FL3 in series by dry etching and wet etching.

After process PR33, processes PR11 to PR13 are performed again. Specifically, a sealing layer SE3 and a stacked film FL3 are formed in the mother substrate MB. A display element DE3 is formed again by patterning these sealing layer SE3 and stacked film FL3. Further, the third lighting inspection is performed again. After process PR33, part of or all of the chambers included in a manufacturing line ML3 may be cleaned before process PR11 is performed again.

In the example of FIG. 18, when a defect is detected regarding an inspection item in a fourth lighting inspection (NG in process PR15), the manufacturing facility is stopped in a manner similar to that of process PR24 of FIG. 6 (process PR34). As another example, the display elements DE1, DE2 and DE3, the resin layer 13, the sealing layer 14 and the resin layer 15 may be removed in process PR34. Further, for this mother substrate MB after the removal, the process from process PR5 may be performed again.

By the manufacturing method of the embodiment, even if a defect is found in the first to third lighting inspections, the mother substrate MB can be reused. By this configuration, a further improvement in yield can be expected.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A manufacturing method of a display device including first, second and third display elements which emit light of different colors, the method including:

preparing a substrate;

forming a first lower electrode, a second lower electrode and a third lower electrode above the substrate;

forming a rib layer on the first lower electrode, the second lower electrode and the third lower electrode, the rib layer including a first aperture overlapping the first lower electrode, a second aperture overlapping the second lower electrode, and a third aperture overlapping the third lower electrode:

forming a partition including a lower portion located on the rib layer, and an upper portion located on the lower portion and having an end portion protruding from a side surface of the lower portion;

forming the first display element on the substrate, the forming the first display element including forming a first stacked film having a first organic layer which is in direct contact with the first lower electrode at the first aperture and emits light based on application of voltage, and a first upper electrode which covers the first organic layer, and forming a first sealing layer which covers the first stacked film; and performing a first lighting inspection for causing the first display element to light up before forming the second display element and the third display element, wherein the first stacked film is formed in an area surrounded by the partition, the first sealing layer continuously covers the first stacked film and the partition, and the first lighting inspection is performed in the air.

2. The manufacturing method of claim 1, further including stopping manufacturing the display device without forming the second display element and the third display element when a defect is detected in the first lighting inspection.

3. The manufacturing method of claim 1, further including:

removing the first display element when a defect is detected in the first lighting inspection; and forming the first display element again on the substrate from which the first display element is removed.

4. The manufacturing method of claim 3, further including performing the first lighting inspection again after forming the first display element again.

5. The manufacturing method of claim 1, further including:

forming the second display element on the substrate after the first lighting inspection, the forming the second display element including forming a second stacked film having a second organic layer which is in direct contact with the second lower electrode at the second aperture and emits light based on application of voltage, and a second upper electrode which covers the second organic layer, and forming a second sealing layer which covers the second stacked film; and performing a second lighting inspection for causing the second display element to light up before forming the third display element, wherein the second stacked film is formed in an area surrounded by the partition, the second sealing layer continuously covers the second stacked film and the partition, and the second lighting inspection is performed in the air.

6. The manufacturing method of claim 5, wherein the second lighting inspection includes:

a process for causing the first display element and the second display element to individually light up; and a process for causing the first display element and the second display element to simultaneously light up.

7. The manufacturing method of claim 5, further including stopping manufacturing the display device without forming the third display element when a defect is detected in the second lighting inspection.

8. The manufacturing method of claim 5, further including:

removing the second display element when a defect is detected in the second lighting inspection; and forming the second display element again on the substrate from which the second display element is removed.

9. The manufacturing method of claim 8, further including performing the second lighting inspection again after forming the second display element again.

10. The manufacturing method of claim 5, further including:

forming the third display element on the substrate after the second lighting inspection, the forming the third display element including forming a third stacked film having a third organic layer which is in direct contact with the third lower electrode at the third aperture and emits light based on application of voltage, and a third upper electrode which covers the third organic layer, and forming a third sealing layer which covers the third stacked film; and performing a third lighting inspection for causing the third display element to light up, wherein the third stacked film is formed in an area surrounded by the partition, the third sealing layer continuously covers the third stacked film and the partition, and the third lighting inspection is performed in the air.

11. The manufacturing method of claim 10, further including stopping manufacturing the display device when a defect is detected in the third lighting inspection.

12. The manufacturing method of claim 10, further including:

removing the third display element when a defect is detected in the third lighting inspection; and forming the third display element again on the substrate from which the third display element is removed.

13. The manufacturing method of claim 12, further including performing the third lighting inspection again after forming the third display element again.

14. The manufacturing method of claim 10, wherein the third lighting inspection includes:

a process for causing the first display element, the second display element and the third display element to individually light up; and a process for causing the first display element, the second display element and the third display element to simultaneously light up.

15. The manufacturing method of claim 10, further including:

forming a resin layer which covers the first display element, the second display element and the third display element; and performing a fourth lighting inspection for causing the first display element, the second display element and the third display element to light up after forming the resin layer.

16. The manufacturing method of claim 10, further including:

after the third lighting inspection, cutting out the display device from the substrate.

17. The manufacturing method of claim 16, wherein the substrate includes a plurality of display devices including the display device, and after the third lighting inspection, one of the plurality of display devices is cut out from the substrate.

18. The manufacturing method of claim 16, wherein the forming the first display element, the forming the second display element, and the forming the third display element are performed in a vacuum environment.

19. The manufacturing method of claim 1, further including:

after the first lighting inspection, cutting out the display device from the substrate.

20. The manufacturing method of claim 5, further including:

after the second lighting inspection, cutting out the display device from the substrate.

\* \* \* \* \*